(12) United States Patent
Lee et al.

(10) Patent No.: US 7,072,183 B2
(45) Date of Patent: Jul. 4, 2006

(54) LOCKING DEVICE FOR HEAT DISSIPATING DEVICE

(75) Inventors: Hsieh-Kun Lee, Tu-Cheng (TW); Dong-Yun Li, Shenzhen (CN); Hong-Bo Shi, Shenzhen (CN); Min Li, Shenzhen (CN)

(73) Assignee: Hon Hai Precision Industry Co., LTD, Tu-cheng (TW)

( * ) Notice: Subject to any disclaimer, the term of this patent is extended or adjusted under 35 U.S.C. 154(b) by 161 days.

(21) Appl. No.: 10/930,340

(22) Filed: Aug. 31, 2004

(65) Prior Publication Data

US 2005/0111191 A1    May 26, 2005

(30) Foreign Application Priority Data

Nov. 21, 2003  (TW) ............................. 92220602 U

(51) Int. Cl.
 *H05K 7/20* (2006.01)
(52) U.S. Cl. ...................... 361/704; 361/695; 361/697; 257/718; 174/16.3; 165/80.3
(58) Field of Classification Search ................ 361/704, 361/719; 257/718, 727; 174/16.3; 165/80.3
See application file for complete search history.

(56) References Cited

U.S. PATENT DOCUMENTS 6,082,440 A * 7/2000 Clemens et al. ........... 165/80.3
6,181,559 B1 * 1/2001 Seo ............................ 361/704
6,450,248 B1 * 9/2002 Chang ........................ 165/80.3
6,522,545 B1 * 2/2003 Shia et al. .................. 361/704
6,542,367 B1 * 4/2003 Shia et al. .................. 361/703
6,822,864 B1 * 11/2004 Huang et al. ............... 361/697
RE38,677 E * 12/2004 Blomquist .................. 361/704
2003/0209341 A1   11/2003 Deboer et al. ............. 165/80.3

FOREIGN PATENT DOCUMENTS

| TW | 370216 | 9/1999 |
| TW | 516810 | 1/2003 |
| TW | 530979 | 5/2003 |

* cited by examiner

*Primary Examiner*—Boris Chervinsky
(74) *Attorney, Agent, or Firm*—Morris, Manning & Martin; Tim Tingkang Xia, Esq.

(57) ABSTRACT

A locking device (30) for mounting a heat sink (40) to a CPU (70), includes a supporting member (32), a pair of locking members (33) pivotably attached to the supporting member and each having a connecting portion (332) and a hook (333), a pressing member (34) resting on the connecting portions, a spring installed between the supporting member and the connecting portions, and an operating member (31) pivotably attached to the supporting member. The operating member is pivotable between a first position at which the operating member abuts against the pressing member and the locking members are located at a released position and a second position at which the abutting portion releases the pressing member to allow the elastic member to drive the locking members to interlock with a retention module around the CPU.

17 Claims, 7 Drawing Sheets

LOCKING DEVICE FOR HEAT DISSIPATING DEVICE

TECHNICAL FIELD

The present invention relates to a locking device, and particularly to a locking device which can conveniently mount a heat sink to an electronic component.

BACKGROUND

As computer technology continues to advance, electronic components such as central processing units (CPUs) of computers are being made to provide faster operational speed and greater functional capabilities. When a CPU operates at a high speed in a computer enclosure, its temperature increases greatly and dramatically. It is desirable to dissipate the generated heat quickly, for example, by using a heat sink attached to the CPU in the enclosure. This allows the CPU and other electronic components in the enclosure to function within their normal operating temperature ranges, thereby assuring the quality of data management, storage and transfer. Generally, a clip is required for mounting the heat sink to the CPU.

In earlier time, a linear type of wire clip was widely used. However, in many modern applications such as when a large heat sink is used, the linear clip cannot firmly retain the heat sink against the CPU. Subsequently, wider plate-type of clips which have good rigidity were developed. A conventional plate-type clip comprises a central pressing portion for pressing a heat sink which is placed on a CPU, and a pair of locking legs extending from the pressing portion. Each locking leg defines a locking opening for retaining a hook of a connector on which the CPU is mounted to thereby secure the heat sink on the CPU. In assembly, the two locking legs are required to moved outward by a user to thereby allow the locking openings of the legs to retain the hooks of the connector. It is complicated and difficult to move the legs in assembly since it has good rigidity. Furthermore, when large force is applied the locking legs are prone to slide over the hooks to damage the CPU or other electronic components adjacent the CPU.

Subsequently cam-type clips were developed. FIG. 7 shows a pair of conventional cam-type clips 90 and a retention module 97. Each clip 90 comprises an integral bracket 91 and a lever 92 having a cam-shaped end and pivotably attached to the body 91. The bracket 91 has a pair of locking legs 94 formed at opposite ends thereof. Each locking leg 94 has an aperture 95 for retaining a corresponding post 98 of the retention module 97. However, the bracket 91 is integral formed and therefore has a large rigidity. As a result, large force is still needed in operation.

SUMMARY OF THE INVENTION

Accordingly, an object of the present invention is to provide a locking device which can firmly and conveniently mount a heat sink to an electronic component.

To achieve the above-mentioned object, a locking device in accordance with a preferred embodiment of the present invention comprises a supporting member, a pair of locking members pivotably attached to the supporting member, a pressing member, an elastic member, and an operating member pivotably attached to the supporting member. Each locking member comprises a connecting portion and a locking means. The pressing member rest on the connecting portions of the locking members. The elastic member is compressible and installed between the supporting member and the connecting portions. The operating member has an abutting portion. The operating member is pivotable between a first position at which the abutting portion presses against the pressing member and the locking members are located at a released position and a second position at which the abutting portion releases the pressing member to allow the elastic member to drive the locking members to a locked position.

Other objects, advantages and novel features of the present invention will be drawn from the following detailed description of a preferred embodiment of the present invention with attached drawings, in which:

DETAILED DESCRIPTION OF A PREFERRED EMBODIMENT

Figure 1:
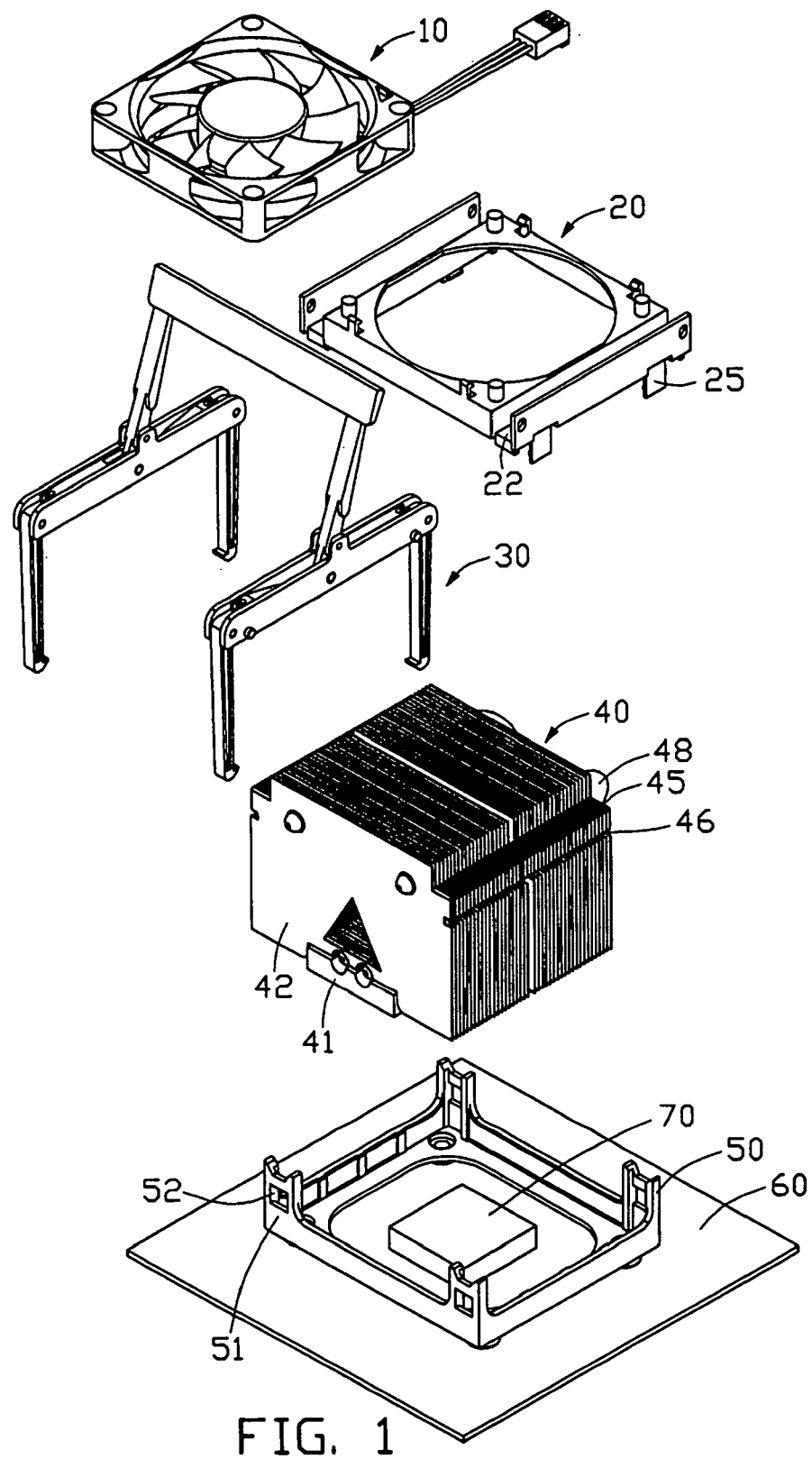
FIG. 1 is an exploded, isometric view of a locking device in accordance with a first preferred embodiment of the present invention, a fan, a fan holder, a heat sink, a CPU mounted on a printed circuit board, and a retention module mounted on the printed circuit board surrounding the CPU.

FIG. 1 shows a locking device 30 in accordance with a preferred embodiment of the present invention, together with a fan 10, a fan holder 20, a heat sink 40 and an electronic component 70 such as a central processing unit (CPU) mounted on a printed circuit board 60 on which a retention module 50 is mounted surrounding the CPU 70. The retention module 50 comprises four locking feet 51 formed at four corners thereof. Each locking foot 51 defines a locking opening 52 therein.

The heat sink 40 comprises a base 41 for contacting the CPU 70 and a plurality of fins 42 extending from the base 41. A pair of cutouts is defined in opposite sides of the top portion of the fins 42 to form a pair of shoulders 45. A pair of grooves 46 is defined in the fins 42 below the shoulders 45. A pair of heat pipes 48 connects the base 41 with the top portion of the fins 42.

The fan holder 20 is used for mounting the fan 10 to the heat sink 40. The fan holder 20 has a frame configuration. The fan holder 20 comprises a pair of stands 22 for resting on the shoulders 45 and two pairs of clasps 25 for engaging with the heat sink 40 in the grooves 46.

Figure 2:
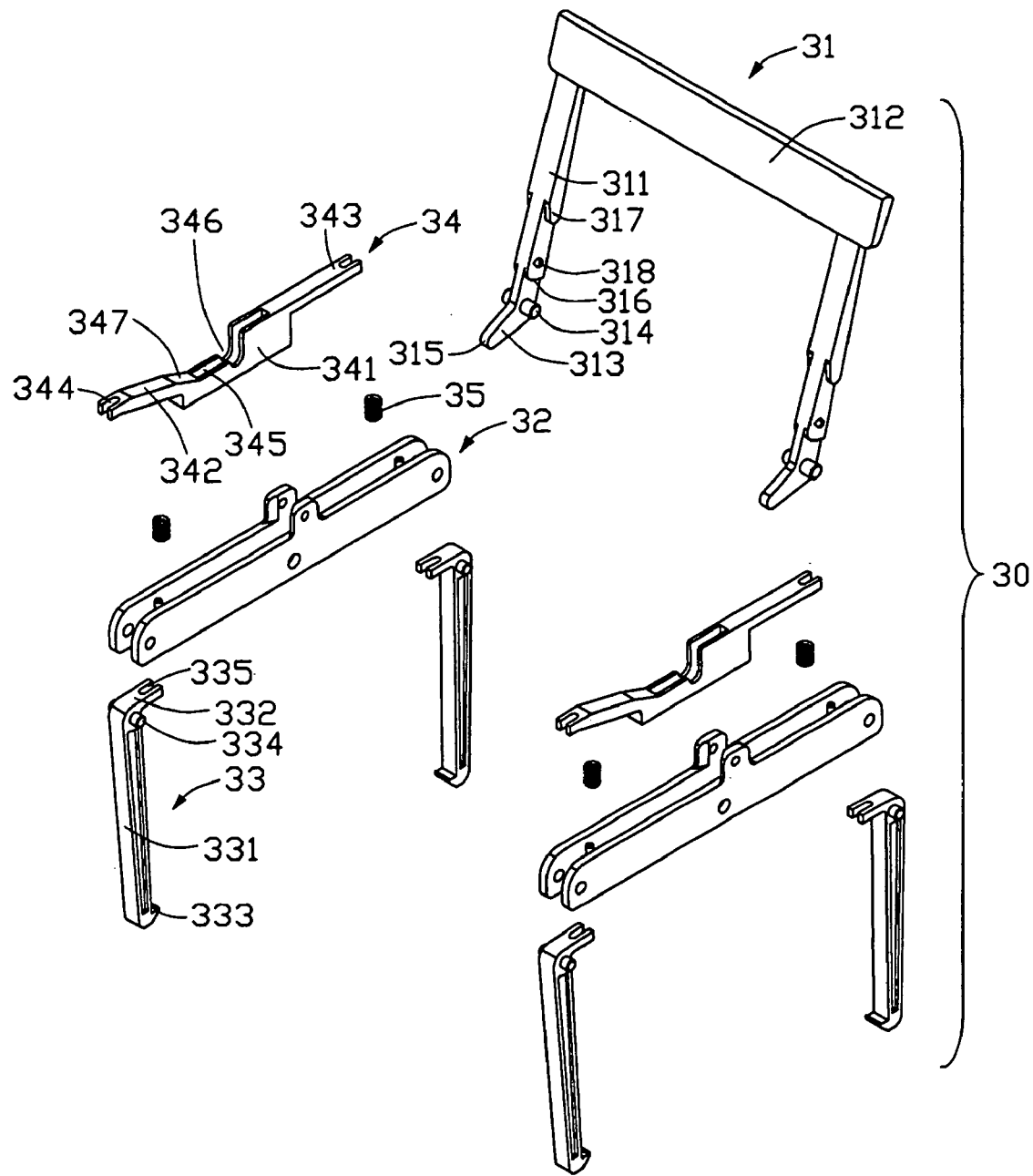
FIG. 2 is an exploded view of the locking device of FIG. 1.

Referring also to FIG. 2, the locking device 30 comprises an opening member 31, a pair of supporting members 32, two pairs of locking members 33, a pair of pressing members 34, two pair of elastic members such as springs 35. The operating member 31 comprises a pair of levers 311 and a handle 312 connected between the pair of levers 311. Each lever 311 comprises a cam 313 as a driving portion thereof formed at a free end of the lever 311, a pair of pivots 314 adjacent the cam 313, a pair of first abutting portions 316 as another driving portion formed above the pivots 314, and a pair of second abutting portions 317 above the first abutting portions 316. Each cam 313 has a bearing surface 315 formed at a distal end thereof. A pair of projections 318 is formed on opposite sides of the lever 311 between the first and second abutting portions 316, 317.

Figure 3:
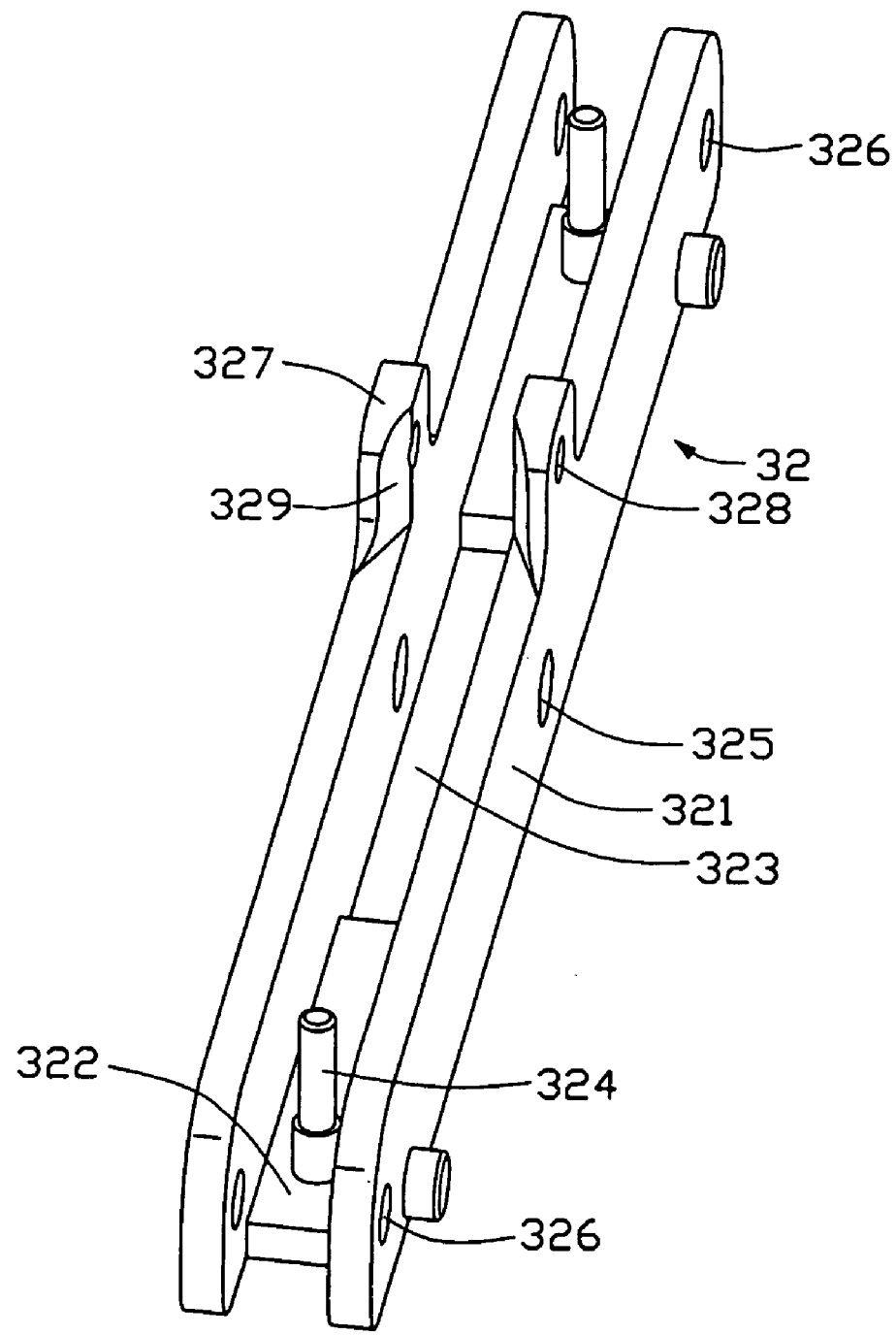
FIG. 3 is an enlarged isometric view of the supporting member of the locking device of FIG. 2.

Referring also to FIG. 3, each supporting member 32 comprises a pair of side walls 321 and a bottom wall 322 connected between the side walls 321. A space is therefore formed between the bottom wall 322 and the side walls 321. A through opening 323 is defined in the bottom wall 322. A pair of posts 324 extends upwardly from the bottom wall 322 on opposite sides of the opening 323 for mounting a pair of springs 35 thereon. A pair of first coaxial holes 325 is defined in the middle portion of the side walls 325 for pivotably receiving the pivots 314 of the operating member 31 therein. Two pairs of second coaxial holes 326 is defined in opposite side portions of the side walls 325. A pair of tabs 327 extends upwardly from the side walls 325 near the first coaxial holes 325. The tabs 327 commonly defines a pair of retaining holes 328. A pair of inclined guiding faces 329 is formed in the tabs 327 adjacent the retaining holes 328, for guiding the projections 318 of the operating member 31 into the retaining holes 328.

Referring back to FIG. 2, each locking member 33 comprises a body 331, a connecting portion 332 extending perpendicularly from a top end of the body 331, and a hook 333 formed at a bottom end of the body 331. A pair of pivots 334 is formed on opposite sides of the connecting portion 332 for being pivotably received in the second holes 326 of the corresponding supporting member 32. An elongated first slot 335 is defined in a distal end of the connecting portion 332.

The pressing member 34 comprises a basis 341 and a pair of extension arms 342, 343 extending from opposite ends of the basis 341. Each extension arm 342, 343 defines an elongated second slot 344. The basis 341 defines an elongated channel 345 therethrough for extension of the cam 313 of the operating member 31. An arcuate cutout 346 is defined in the basis 341. An inclined face 347 is formed at the extension arm 342 adjacent to the channel 345.

Figure 4:
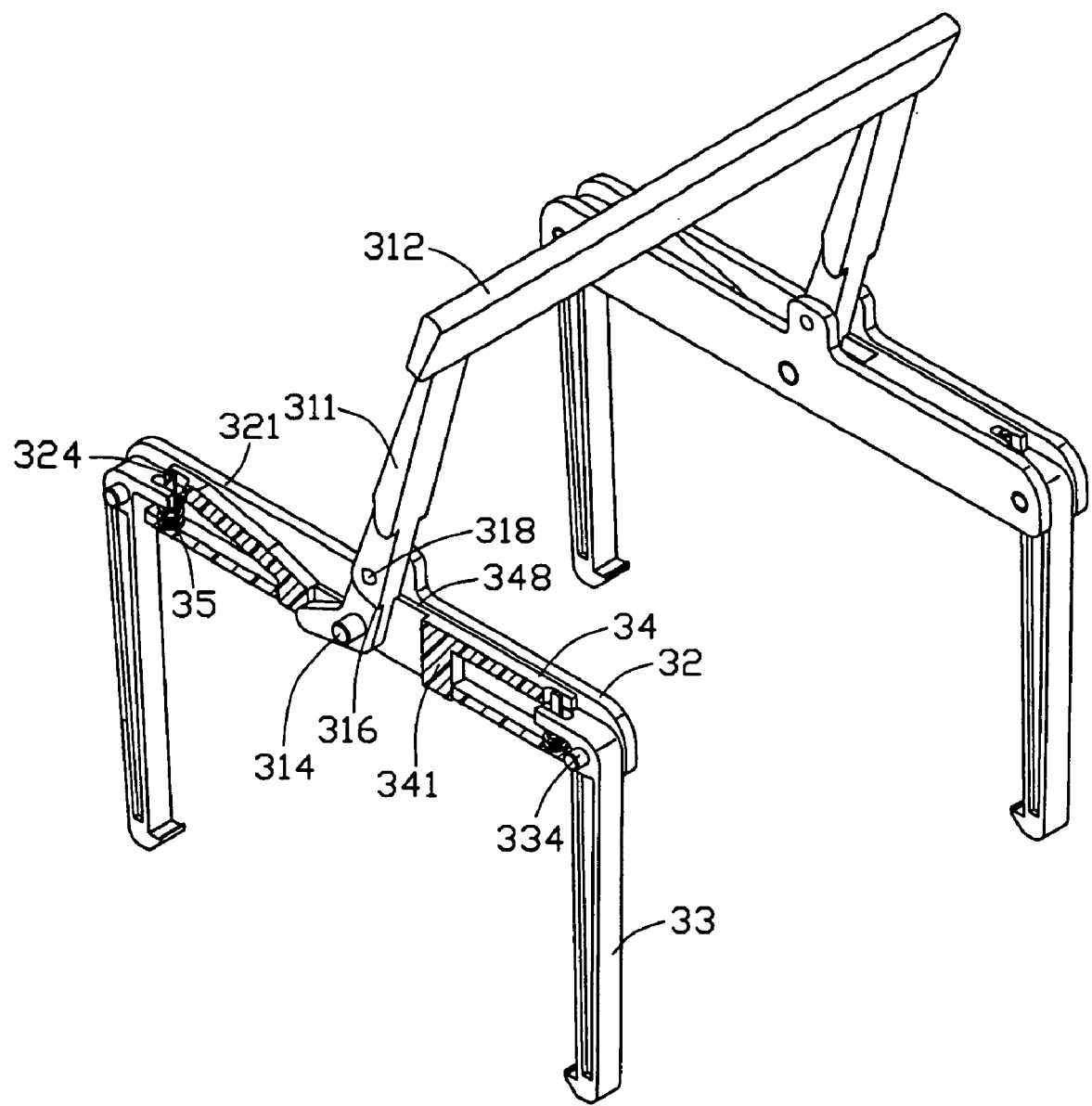
FIG. 4 is a partly cross section view of the assembled locking device of FIG. 2.

Referring also to FIG. 4, in assembly, the springs 35 are surroundingly mounted on the corresponding posts 324 of the supporting members 32. The locking members 33 are connected to the supporting members 32 via the pivots 334 of the locking members 33 pivotably received in the corresponding second holes 326 of the supporting members 32. The pressing members 34 are received in the spaces of the supporting members 32 with the bases 341 further received in the openings 323 of the supporting members 32 and free ends of the extension arms 342, 343 resting on the connecting portions 332 of the locking members 33. The second slots 344 are aligned with the first slots 335 to allow the posts 324 of the supporting members 32 to extend through the slots 335, 344 at the same time. The operating member 31 is then attached to the supporting members 32 via the pivots 314 of the operating member 31 pivotably received in the first holes 325 of the supporting members 32. The cams 313 extend through the channels 345 of the pressing members 34 and the openings 323 of the supporting members 32. The handle 312 of the operating member 31 is pushed to rotate in a first direction to cause the projections 318 to slide over the guiding faces 329 to be retained in the retaining holes 328 of the supporting members 32. At this moment, the first abutting portions 316 abut against the top surfaces of the pressing members 34. The springs 35 are compressed between the bottom walls 322 of the supporting members 32 and the connecting portions 332 of the locking members 33. Each locking member 33 is angled to the supporting member 32 with an obtuse angle. The cutouts 346 of the pressing members 34 are located below the corresponding pivots 314. The operating member 31 is located at a first position and the locking members 33 are located at a released position.

Figure 5:
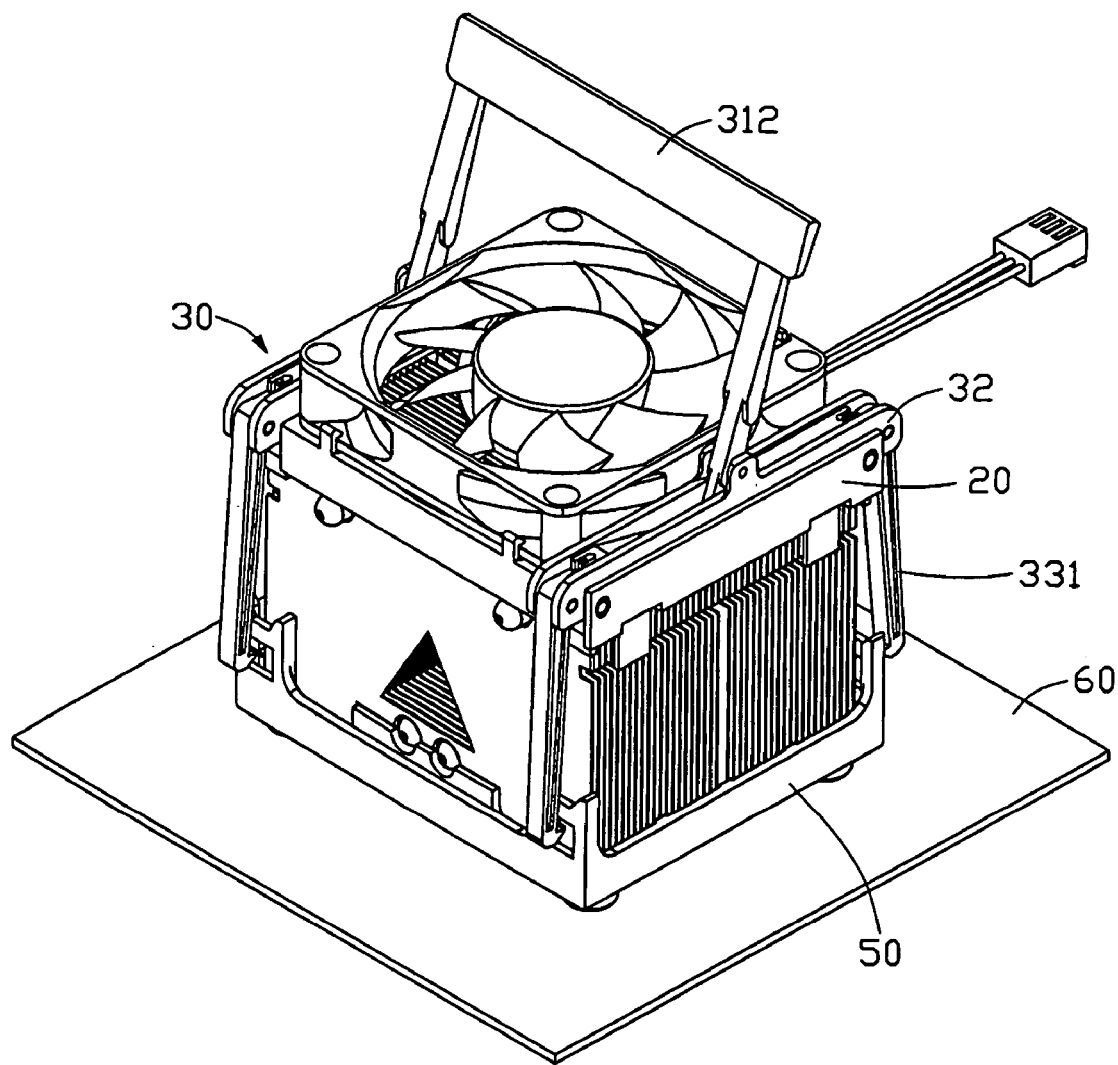
FIG. 5 is an assembled view of FIG. 1 with the locking device located at a release position.
Figure 6:
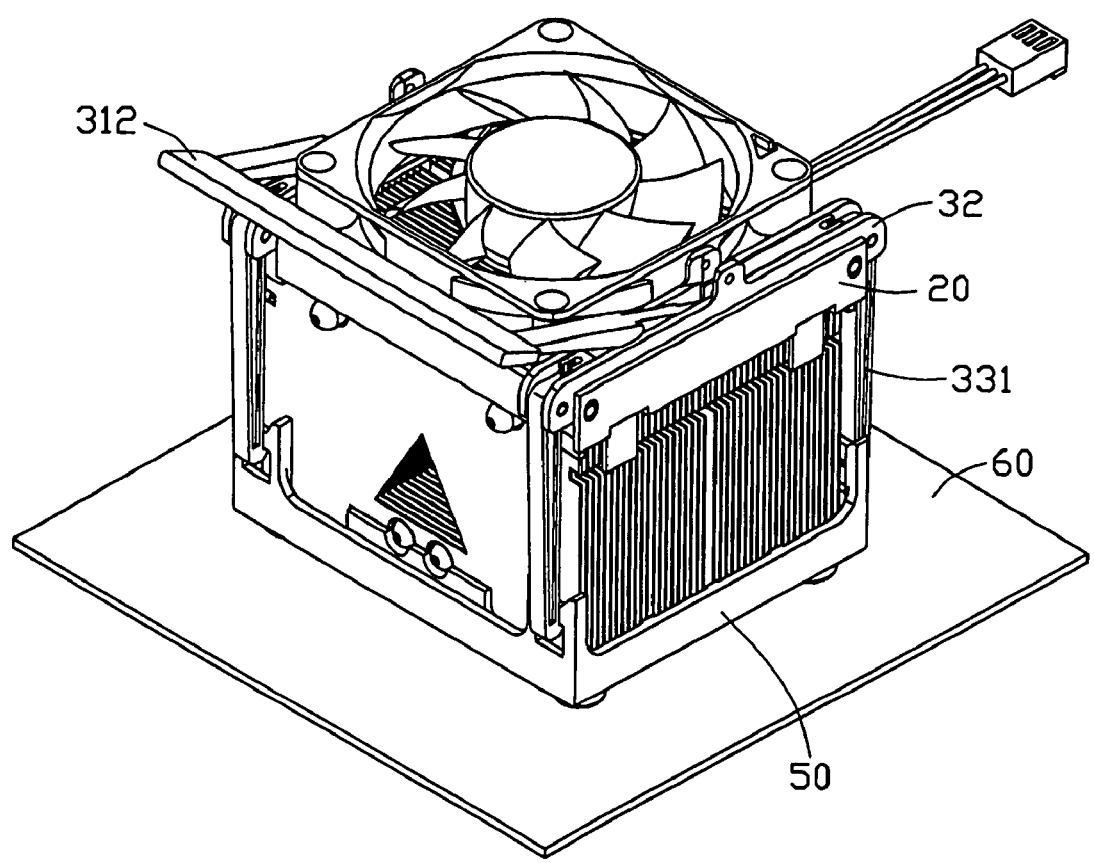
FIG. 6 is an assembled view of FIG. 1 with the locking device located at a locked position.
Figure 7:
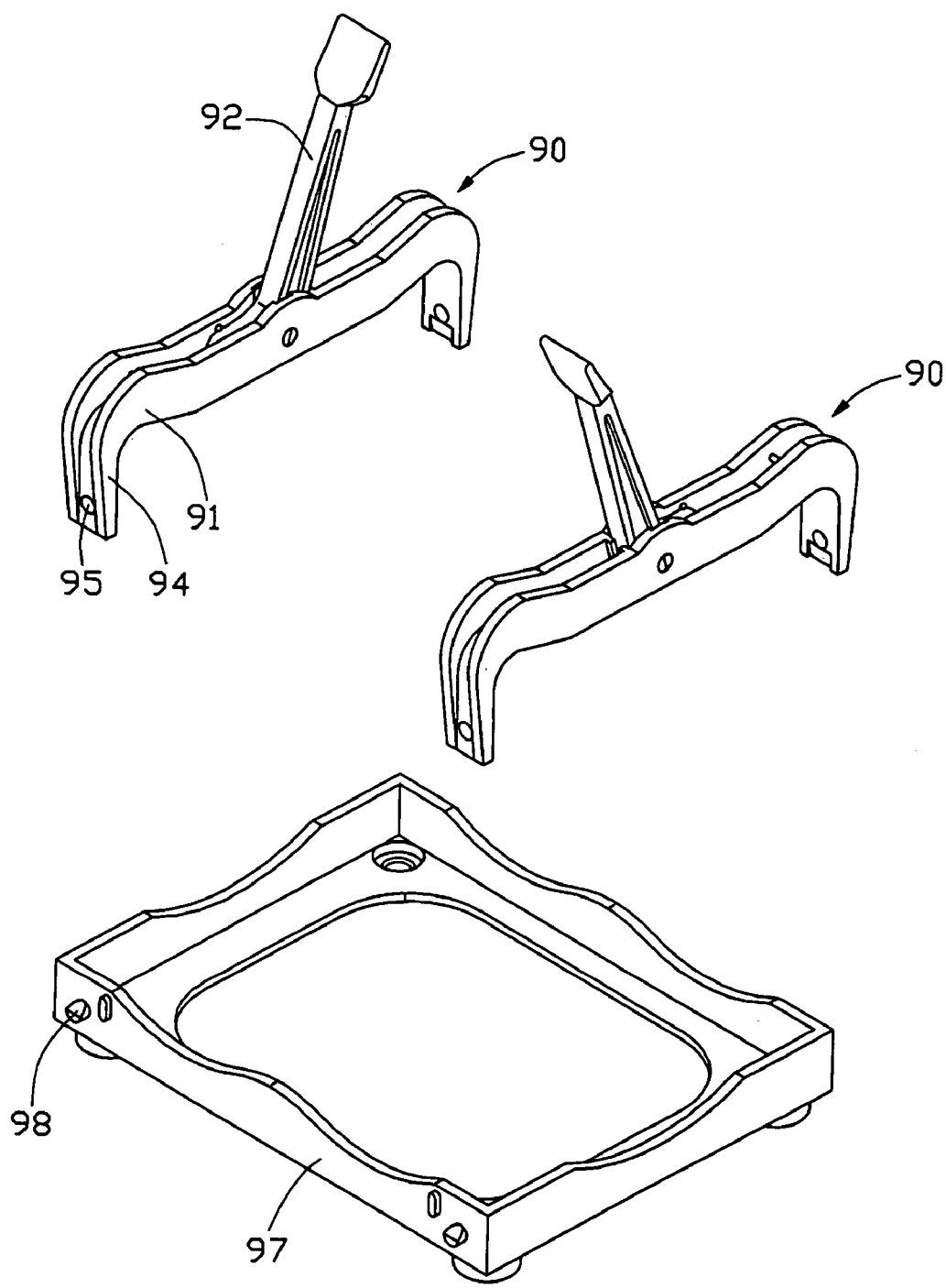
FIG. 7 is an exploded view of a conventional locking device.

Referring to FIGS. 5–6, in operation, the locking device 30 is placed on the fan holder 20 with the supporting members 32 resting on the stands 22. The hooks 333 of the locking device 30 are located outside of the locking feet 51 of retention module 50 facing the corresponding locking openings 52. The handle 312 of the locking device 30 is pushed to rotate in a second direction opposing the first direction to cause the projections 318 of the levers 311 to be released from the retaining holes 328 of the supporting members 32. While the handle 312 continues moving along the second direction, the first abutting portions 316 are removed away from the top surface of the pressing members 34. The springs 35 are therefore released to return back to their original states. The connecting portions 332 of the locking members 33 are pushed upwardly by the springs 35 to cause the locking members 33 to pivot about the pivots 334 toward the retention module 50. The hooks 333 of the locking members 33 therefore move into the corresponding locking openings 52. Simultaneously, the pressing members 34 are pushed upwardly until the cutouts 346 thereof abut against the pivots 314 of the operating members 311. The handle 312 is continued to be pushed in the second direction until the second abutting portions 317 abut against the top surfaces of the supporting members 32 and the levers 311 bear on the inclined faces 347 of the pressing members 34. The bearing surfaces 315 of the cams 313 of the levers 311 abut against the stands 22 of the fan holder 20 to cause the supporting members 32 and the locking members 33 to move upwardly. The hooks 333 of the locking members 33 are therefore firmly interlocked with the feet 51 of the retention module 50 in the corresponding locking openings 52. At this moment, the operating members 31 is located at a second position and the locking members 33 are located at a locked position. Thus, the locking device 30 firmly mounts the heat sink 10 to the CPU 70.

In disassembly, the operating member 31 is pulled to rotate in the first direction to the first position by operation on the handle 312. The abutting surfaces 315 of the cams 313 of the operating member 31 are removed away from the stands 22 of the fan holder 20. The supporting members 32 and the pressing members 34 are moved downwardly. The locking members 33 are accordingly moved downwardly. The first abutting portions 316 press the pressing members 34 to cause the extension arms 342, 343 of the pressing members 34 to press the connecting portions 332 of the locking members 33 downwardly. The locking members 33 therefore pivot about the pivots 334 away from the retention module 50 to free the hooks 333 from the locking openings 52 of the retention module 50.

It is understood that the invention may be embodied in other forms without departing from the spirit thereof. Thus, the present example and embodiment is to be considered in all respects as illustrative and not restrictive, and the invention is not to be limited to the details given herein.

What is claimed is:
1. A locking device comprising:
   a supporting member;
   a pair of locking members pivotably attached to the supporting member, each locking member comprising a connecting portion and a locking means;

a pressing member resting on the connecting portions of the locking members;

an elastic member installed between the supporting member and the connecting portions; and an operating member pivotably attached to the supporting member, the operating member having an abutting portion; wherein the operating member is pivotable between a first position at which the abutting portion abuts against the pressing member and the locking members are located at a released position and a second position at which the abutting portion releases the pressing member to allow the elastic member to drive the locking members to a locked position.

2. The locking device as claimed in claim 1, wherein a distance between the locking means at the released position is smaller than the distance between the locking means at the locked position.

3. The locking device as claimed in claim 2, wherein the supporting member comprises a bottom wall and a pair of side walls cooperatively defining a space therebetween, the pressing member received in the space.

4. The locking device as claimed in claim 3, wherein the pressing member comprises a basis and a pair of extension arms pressed on the connecting portions of the locking members respectively.

5. The locking device as claimed in claim 4, wherein each of the connecting portions of the locking members define a first slot, each of the extension arms defines a second slot, and a pair of posts extends from the bottom wall of the supporting member through the first and second slots.

6. The locking device as claimed in claim 5, wherein the elastic member comprises a pair of springs surrounding the posts respectively.

7. The locking device as claimed in claim 4, wherein the operating member comprises a cam formed at an end thereof, the cam extending through the basis of the pressing member and the bottom wall of the supporting member.

8. The locking device as claimed in claim 5, wherein the operating member comprises at least one projection, and the side walls of the supporting member defines at least one retaining hole for retaining said projection therein at the second position.

9. The locking device as claimed in claim 1, wherein the operating member comprises a pair of levers pivotably attached to a pair of supporting members, and a handle connected between the levers.

10. A combination comprising:
an electronic component with at least two latching members provided thereabout;
a heat sink placed on the electronic component; and
a locking device mounting the heat sink on the electronic component, the locking device comprising:
a supporting member supported on the heat sink;
a pair of locking members discrete from and pivotably connected to the supporting member;
a pressing member resting on the locking members;
an operating member movably connected to the supporting member; and
means for driving the locking members to interlock with the latching members when the operating member is moved from a first position at which the locking members are released from the latching members to a second position.

11. The combination as claimed in claim 10, wherein the operating member comprises an abutting portion bearing against the pressing member at the first position and releasing the pressing member at the second position.

12. The combination as claimed in claim 10, wherein the operating member comprises a cam exerting a force to the heat sink at the second position and releasing the force at the first position.

13. The combination as claimed in claim 10, wherein the driving means comprises a pair of elastic members installed between the supporting member and the locking members.

14. The combination as claimed in claim 10, wherein the latching means comprises a locking opening defined in a retention module surrounding the electronic component.

15. The combination as claimed in claim 10, further comprising a fan holder mounted on the heat sink, the supporting members of the locking device supported on the fan holder.

16. A locking device to mount a heat sink onto an electronic component having at least one latching member disposed next to the periphery of said electronic component, comprising:
a supporting member having a locking member attached thereto, said locking member corresponding to said at least one latching member and capable of being complementarily engagable to said at least one latching member;
an operating member being attached to said supporting member and moveable from a first position to a second position, said operating member having a first and a second driving portion, and said operating member being capable of staying in said first position to enable said first driving portion to drive said locking member of said supporting member and staying in said second position to enable said second driving portion to drive said supporting member; and
enablement of said second driving portion to drive movement of said supporting member allowing engagement of said locking member and said at least one latching member, and enablement of said first driving portion to drive movement of said locking member allowing disengagement said locking member and said at least one latching member.

17. The locking device as claimed in claim 16, wherein the driving direction of said first driving portion of said operating member is substantially parallel to the one of said second driving portion of said operating member.

* * * * *